(12) United States Patent
Kang

(10) Patent No.: US 8,901,704 B2
(45) Date of Patent: Dec. 2, 2014

(54) INTEGRATED CIRCUIT AND MANUFACTURING METHOD THEREOF

(75) Inventor: Hee Bok Kang, Cheongju-si (KR)

(73) Assignee: SK Hynix Inc., Gyeonggi-do (KR)

( * ) Notice: Subject to any disclaimer, the term of this patent is extended or adjusted under 35 U.S.C. 154(b) by 752 days.

(21) Appl. No.: 11/785,866

(22) Filed: Apr. 20, 2007

(65) Prior Publication Data

US 2007/0252185 A1    Nov. 1, 2007

(30) Foreign Application Priority Data

Apr. 21, 2006 (KR) .................. 10-2006-0036278
Apr. 21, 2006 (KR) .................. 10-2006-0036279
Apr. 24, 2006 (KR) .................. 10-2006-0036874
Feb. 14, 2007 (KR) .................. 10-2007-0015440

(51) Int. Cl.
   *H01L 21/02*   (2006.01)
   *H01L 27/115*  (2006.01)
   *H01L 27/105*  (2006.01)

(52) U.S. Cl.
   CPC ........ *H01L 27/11502* (2013.01); *H01L 27/105* (2013.01); *H01L 27/11507* (2013.01); *H01L 27/11509* (2013.01)
   USPC ........... 257/532; 257/499; 257/512; 257/516; 257/528; 257/529; 257/536; 257/537; 257/E27.108; 257/E21.646; 257/E21.664; 438/393; 438/396; 365/185.08; 365/64; 365/145; 365/149; 365/181

(58) Field of Classification Search
   CPC .. G11C 11/22; G11C 11/5657; G11C 11/223; H01L 27/11502; H01L 27/11507; H01L 27/108; H01L 28/55; H01L 28/40; H01L 21/31691; H01L 27/10808; H01L 21/28291; H01L 27/1159; H01L 29/784; H01L 27/10814; H01L 27/10817; H01L 28/65; H01L 21/31122; H01L 27/10852
   USPC .......... 257/288, 295, 299, E21.664, 269–310, 257/532, 499, 512, 516, 528, 529, 536, 537, 257/E27.001, E27.006, E27.107, E27.108, 257/E21.646, E21.66, E21.63; 438/393, 438/396; 365/185.08, 64, 145, 149, 181, 365/182
   See application file for complete search history.

(56) References Cited

U.S. PATENT DOCUMENTS 6,130,576 A * 10/2000 Manning .................. 327/567
6,218,197 B1    4/2001 Kasai
(Continued)

FOREIGN PATENT DOCUMENTS

KR    2000-0013393      3/2000
KR    2003-0097697     12/2003
KR    10-2007-0104186  10/2007

OTHER PUBLICATIONS

Office Action from Korean Patent Office for Korean Patent Application No. 10-2007-0015440 dated Jan. 18, 2008.

(Continued)

*Primary Examiner* — Meiya Li
(74) *Attorney, Agent, or Firm* — IP & T Group LLP

(57) ABSTRACT

An integrated circuit and a manufacturing method thereof are provided. A chip size can be reduced by forming a memory device in which a ferroelectric capacitor region is laminated on a DRAM. The integrated circuit includes a cell array region having a capacitor, a peripheral circuit region, and a ferroelectric capacitor region being formed on an upper layer of the cell array region and the peripheral circuit region, and having a ferroelectric capacitor device.

18 Claims, 20 Drawing Sheets

(56) References Cited

U.S. PATENT DOCUMENTS

| | | | |
|---|---|---|---|
| 6,262,446 B1* | 7/2001 | Koo et al. | 257/296 |
| 6,420,744 B1* | 7/2002 | Kim et al. | 257/295 |
| 7,094,611 B1* | 8/2006 | Hayashi | 438/3 |
| 2002/0153553 A1 | 10/2002 | Kastner et al. | |
| 2002/0173111 A1* | 11/2002 | Kasai | 438/396 |
| 2003/0043618 A1 | 3/2003 | Nakura et al. | |
| 2003/0156439 A1* | 8/2003 | Ohmichi et al. | 363/98 |
| 2003/0235071 A1* | 12/2003 | Okazawa | 365/158 |
| 2004/0029298 A1* | 2/2004 | Casagrande et al. | 438/3 |
| 2004/0232497 A1* | 11/2004 | Akiyama et al. | 257/390 |
| 2004/0245547 A1 | 12/2004 | Stipe | |
| 2005/0161716 A1 | 7/2005 | Matsuura et al. | |
| 2005/0201140 A1* | 9/2005 | Chow et al. | 365/145 |
| 2006/0007771 A1* | 1/2006 | Sato | 365/226 |
| 2006/0024878 A1* | 2/2006 | Forbes et al. | 438/211 |
| 2008/0104458 A1* | 5/2008 | Uchida | 714/719 |

OTHER PUBLICATIONS

Office Action from Korean Patent Office for Korean Patent Application No. 10-2006-0036874 dated Dec. 17, 2007.

\* cited by examiner

INTEGRATED CIRCUIT AND MANUFACTURING METHOD THEREOF

RELATED APPLICATIONS

This application is based upon and claims the benefit of priority to Korean Patent Application Nos. 10-2006-0036874, filed on Apr. 24, 2006; 10-2007-0015440, filed on Feb. 14, 2007; 10-2006-0036278, filed on Apr. 21, 2006; and 10-2006-0036279, filed on Apr. 21, 2006. The entire content of these applications are hereby incorporated herein by reference in their entirety.

BACKGROUND

1. Technical Field

The present invention relates to an integrated circuit and a manufacturing method thereof, and more particularly, to an integrated circuit which can maximize an area of a capacitance capacitor without increasing a layout area. This may be done by forming a memory device in which a DRAM and a ferroelectric capacitor region are laminated.

2. Description of the Related Art

An integrated circuit is a basic device used in various electronic apparatuses, such as a computer system, a communication system, etc. Exemplary integrated circuits include a variety of circuits, such as a memory device, a digital signal processor (DSP), a system-on-chip (SoC), and a radio frequency identification (RFID) tag. In such integrated circuits, as many capacitors are designed to be included as chip layout allows.

For example, a ferroelectric random access memory (FeRAM) shows a data processing speed equivalent to that of a dynamic random access memory (DRAM), and preserves data even in a power off mode. Thus, FeRAM has been regarded as a next generation memory device. Moreover, FeRAM, which is a memory device almost identical in structure to DRAM, uses high remanent polarization which is a characteristic of a ferroelectric by employing the ferroelectric as a capacitor material. Even if an electric field is removed, data is not erased due to remanent polarization.

However, in a conventional RFID device, the RFID tag roughly consists of an analog block, a digital block, and a memory block. Such an RFID chip passive device must have a small layout area to minimize the production cost.

The conventional RFID device adopts a MOS capacitor or a polysilicon-insulator-polysilicon (PIP) or metal-insulator-metal (MIM) capacitor in formation of a capacitance capacitor of a pump circuit or another capacitance capacitor. In the case that the insulator is a paraelectric, a dielectric constant is reduced to relatively increase an area of the capacitor.

In addition, in a conventional integrated circuit such as a memory device, RFID device, SoC, or FeRAM, a peripheral circuit region and a capacitor region are disposed in separate regions on the same layer. That is, the MOS capacitor or the PIP or MIM capacitor has the same process level as that of the peripheral circuit region. Accordingly, in the conventional integrated circuit, the capacitor region and the peripheral circuit region cannot be formed in a lamination type to reduce the whole layout area.

For example, in an integrated circuit such as PRAM, MRAM, or flash, a memory cell does not include a capacitor. In the DRAM, a capacitor for a cell is used in a memory cell, and the MOS capacitor or the PIP or MIM capacitor is used in the peripheral circuit region. Since the circuit region using a complementary metal-oxide-semiconductor (CMOS) circuit and the capacitor are formed in the same process level, they cannot be formed in a lamination type.

In the conventional integrated circuit, the capacitor and the peripheral circuit region are disposed in different regions on the same layer. Therefore, the whole layout area is determined as the sum of the layout of the peripheral circuit region and the layout of the capacitor region. Thus, the whole layout area of the integrated circuit is increased.

On the other hand, as the capacitance of the DRAM increases, the operation voltage is decreased and power noise is increased. A capacitance of a capacitor required in a power pump for generating various internal voltages such as a pumping voltage VPP and a back bias voltage VBB is increased, and a capacitance of decoupling capacitors formed at an output terminal of the pump and a power terminal is increased. As a result, the area occupied by the decoupling capacitor and the capacitor associated with the pump is not reduced.

BRIEF SUMMARY

Consistent with the invention, an integrated circuit includes: a cell array region; a peripheral circuit region; and a ferroelectric capacitor region having a ferroelectric capacitor device and being formed on an upper layer of the cell array region and the peripheral circuit region.

Consistent with the present invention, the integrated circuit includes: a DRAM including a bank region having a cell capacitor, a peripheral circuit region; and a ferroelectric capacitor region being formed on an upper layer of the DRAM, and having a ferroelectric capacitor device, wherein a part of the peripheral circuit region uses the ferroelectric capacitor device.

Consistent with the present invention, the integrated circuit includes: a cell array region having a ferroelectric capacitor; and a peripheral circuit region, wherein a ferroelectric capacitance unit having a ferroelectric capacitor device is formed on an upper layer of the peripheral circuit region.

Consistent with the present invention, the integrated circuit includes: an analog block for receiving a radio frequency signal and outputting an operation command signal; a digital block for generating and outputting an address and an operation control signal according to the operation command signal from the analog block and outputting a response signal corresponding to the operation command signal to the analog block; and a memory block for receiving the operation control signal, generating an internal signal, and reading/writing data on a nonvolatile ferroelectric capacitor device according to the internal signal wherein a ferroelectric capacitance unit having a ferroelectric capacitor device is formed on an upper layer of a peripheral circuit region.

Consistent with the present invention, the integrated circuit includes: an analog block for receiving a radio frequency signal, and outputting an operation command signal; a digital block for generating and outputting an address and an operation control signal according to the operation command signal from the analog block, and outputting a corresponding response signal to the analog block; and a memory block for receiving the operation control signal, generating an internal adjustment signal, and reading/writing data on a nonvolatile ferroelectric capacitor device according to the internal adjustment signal, wherein a ferroelectric capacitance unit having a ferroelectric capacitor device is formed on an upper layer of the analog block.

Consistent with the present invention, the integrated circuit includes: an analog block for receiving a radio frequency signal, and outputting an operation command signal; a digital block for generating and outputting an address and an operation control signal according to the operation command signal from the analog block, and outputting a corresponding response signal to the analog block; and a memory block for receiving the operation control signal, generating an internal adjustment signal, and reading/writing data on a nonvolatile ferroelectric capacitor device according to the internal adjustment signal, wherein a ferroelectric capacitance unit having a ferroelectric capacitor device is formed on an upper layer of the digital block.

Consistent with the present invention, the integrated circuit includes a system-on-chip including a cell array region having a ferroelectric capacitor; and a peripheral circuit region, wherein a ferroelectric capacitance unit having a ferroelectric capacitor device is formed on an upper layer of the peripheral circuit region.

Consistent with the present invention, the integrated circuit includes an FeRAM including a cell array region having a ferroelectric capacitor and a peripheral circuit region, wherein a ferroelectric capacitance unit having a ferroelectric capacitor device is formed on an upper layer of a CMOS circuit region of the peripheral circuit region.

Consistent with the present invention, the integrated circuit includes a cell array region having a plurality of memory cells and a peripheral circuit region, wherein a lamination type capacitor is formed at the upper portion of the peripheral circuit region.

Consistent with the present invention there is provided a manufacturing method of an integrated circuit including forming a peripheral circuit region on a substrate; forming a cell capacitor at an upper portion of the peripheral circuit region; forming a metal line at an upper portion of the cell capacitor and the upper portion of the peripheral circuit region; and forming a ferroelectric capacitor region at an upper portion of the metal line.

BRIEF DESCRIPTION OF THE DRAWINGS

The above aspects and features of consistent with the present invention will be more apparent by describing certain embodiments consistent with the present invention with reference to the accompanying drawings, in which.

DETAILED DESCRIPTION

An integrated circuit and a manufacturing method thereof in accordance with preferred embodiments consistent with the present invention will now be described in detail with reference to the accompanying drawings.

Figure 1:
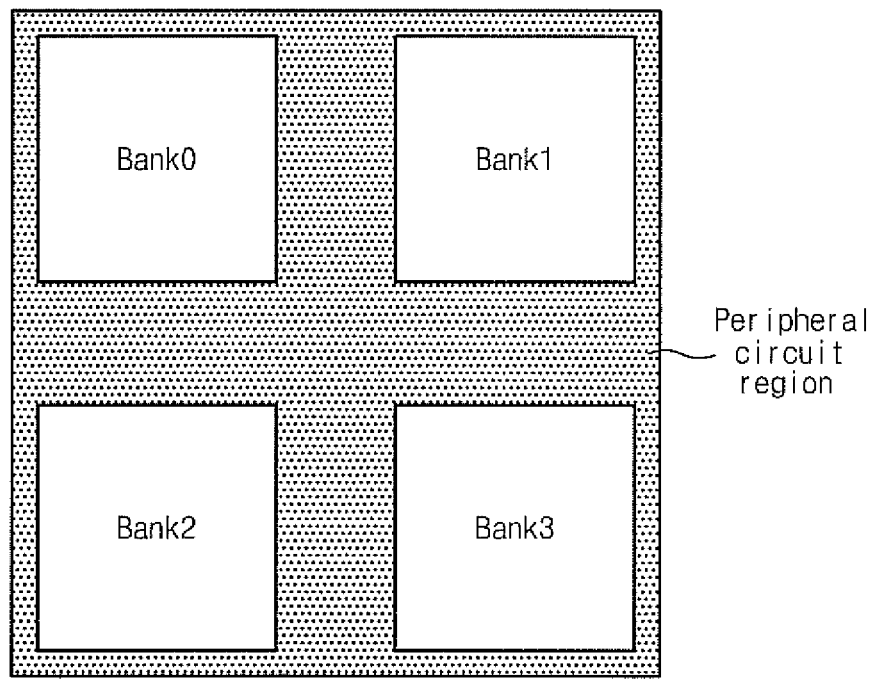
FIG. 1 is a chip layout view illustrating a general DRAM.

FIG. 1 is a chip layout view illustrating a general DRAM.

In the DRAM, bank 0 to bank 3 represent DRAM cell array regions. A peripheral circuit region represents a circuit region including a pump capacitor and a decoupling capacitor.

Figure 2:
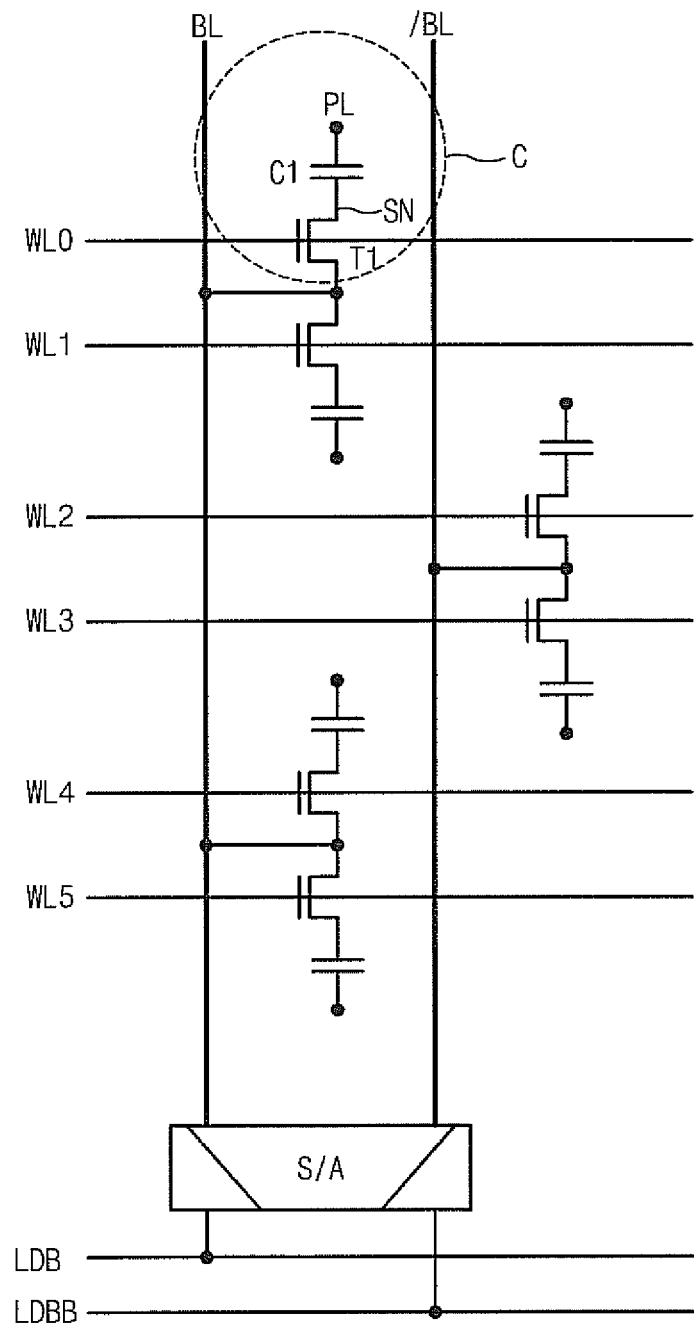
FIG. 2 is a detailed circuit view illustrating a cell array of a general bank.

FIG. 2 is a detailed circuit view illustrating a cell array of the general bank. Here, a folded bit line structure and a latch type bit line sense amplifier are exemplified.

A unit cell C of the DRAM includes an NMOS transistor T1 adjusted by a word line WL0, and a capacitor C1. A drain terminal of the NMOS transistor T1 is connected to a bit line BL, and a source terminal thereof is connected to one electrode of capacitor C1. One electrode of capacitor C1 is defined as a storage node SN for storing written charges.

Another terminal of capacitor C1 is connected to a common cell plate line PL. A cell plate voltage VCP is applied through cell plate line PL. Cell plate voltage VCP is defined as a half power voltage VDD. Power voltage VDD is defined as a high operation voltage of the cell.

Both output terminals of the latch type bit line sense amplifier S/A are connected to a bit line pair BL and /BL. When word line WL0 is enabled to transfer cell data to bit line BL, bit line/BL supplies a reference voltage REF. Conversely, when word line WL1 is enabled to transfer cell data to bit line/BL, bit line BL supplies reference voltage REF (not shown).

The data input/output operations of a data buffer and the bit line sense amplifier S/A are performed by a local data bus pair LDB and LDBB.

Figure 3:
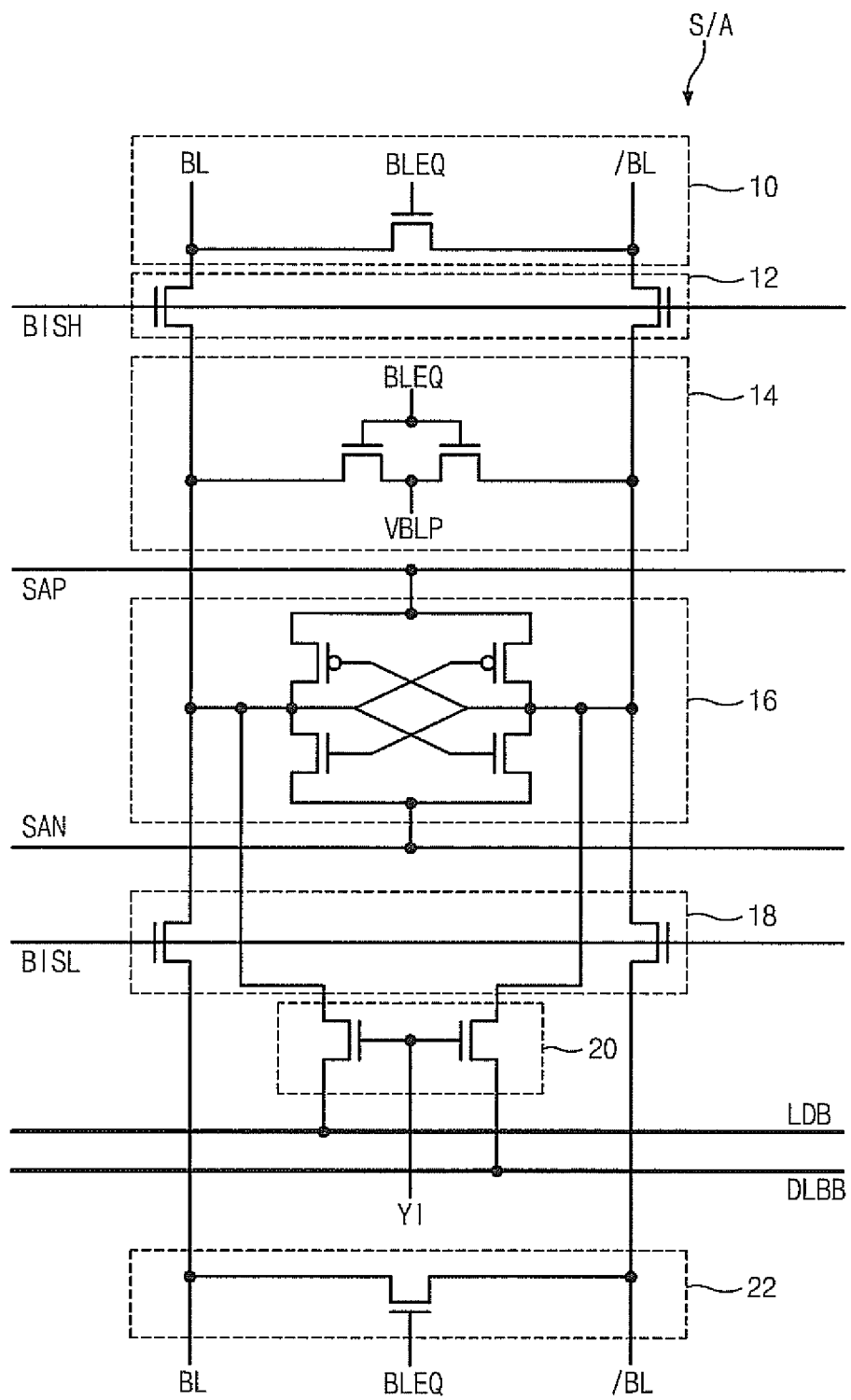
FIG. 3 is a detailed circuit view illustrating a general latch type bit line sense amplifier.

FIG. 3 is a detailed circuit view illustrating the general latch type bit line sense amplifier.

The latch type bit line sense amplifier includes equalizing units 10 and 22, bit line selection units 12 and 18, a bit line precharge unit 14, an amplification unit 16 and a selection unit 20.

Equalizing units 10 and 22 equalize voltages between bit line pair BL and /BL when a bit line equalizing signal BLEQ is enabled. Bit line selection units 12 and 18 perform data exchange between amplification unit 16 and bit line pair BL and /BL when bit line selection signals BISH and BISL are enabled.

In addition, bit line precharge unit 14 precharges bit line pair BL and /BL by supplying a bit line precharge voltage VBLP to bit line pair BL and /BL by using bit line equalizing signal BLEQ. Here, bit line precharge voltage VBLP is defined as half power voltage VDD. A pull-up enabling terminal of amplification unit 16 is adjusted by a control signal SAP, and a pull-down enabling terminal thereof is adjusted by a control signal SAN. Accordingly, amplification unit 16 senses and amplifies the data applied to bit line pair BL and /BL. Selection unit 20 controls the data input/output operations between amplification unit 16 of bit line sense amplifier S/A and local data bus pair LDB and LDBB according to a column selection signal YI.

Figure 4:
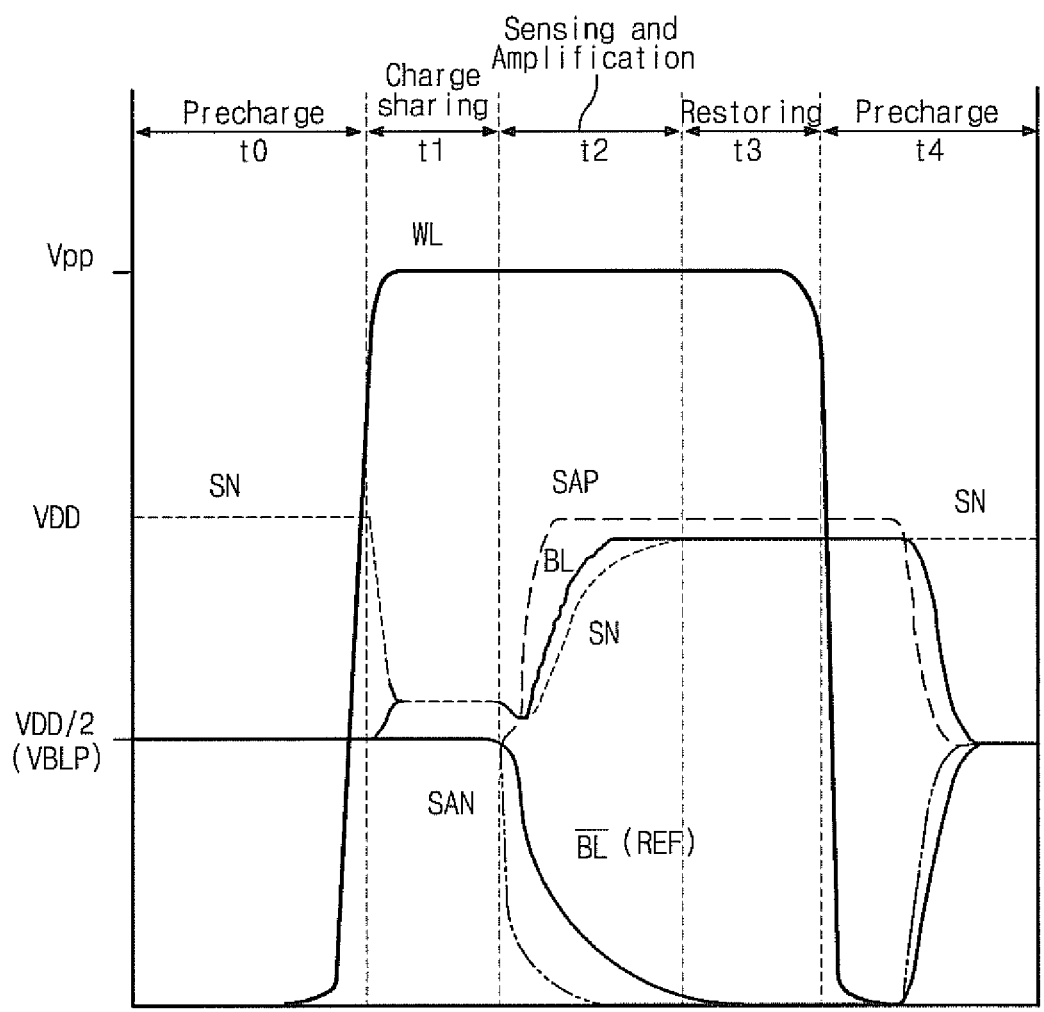
FIG. 4 is a timing view illustrating a general cell array and a sensing related operation.

FIG. 4 is a timing view illustrating the general cell array and the related sensing operation.

First, in a precharge period t0, the voltages of bit line pair BL and /BL and control signals SAN and SAP of bit line sense amplifier S/A are precharged with bit line precharge voltage VBLP. Here, the bit line precharge voltage is defined as the half power voltage VDD, and also defined as a half voltage of cell high voltage VDD.

In a charge sharing period t1, word line WL is enabled to load the cell data on bit line pair BL and /BL.

In a sensing and amplification period t2, control signal SAN is transited to the ground voltage and control signal SAP is transited to cell high voltage VDD to amplify the data loaded on bit line pair BL and /BL. Therefore, bit line pair BL and /BL is amplified to cell high voltage VDD and the ground voltage.

In a restore period t3, the data amplified on bit line pair BL and /BL are rewritten on the cell. A precharge period t4 is restarted after the rewriting operation.

Figure 5:
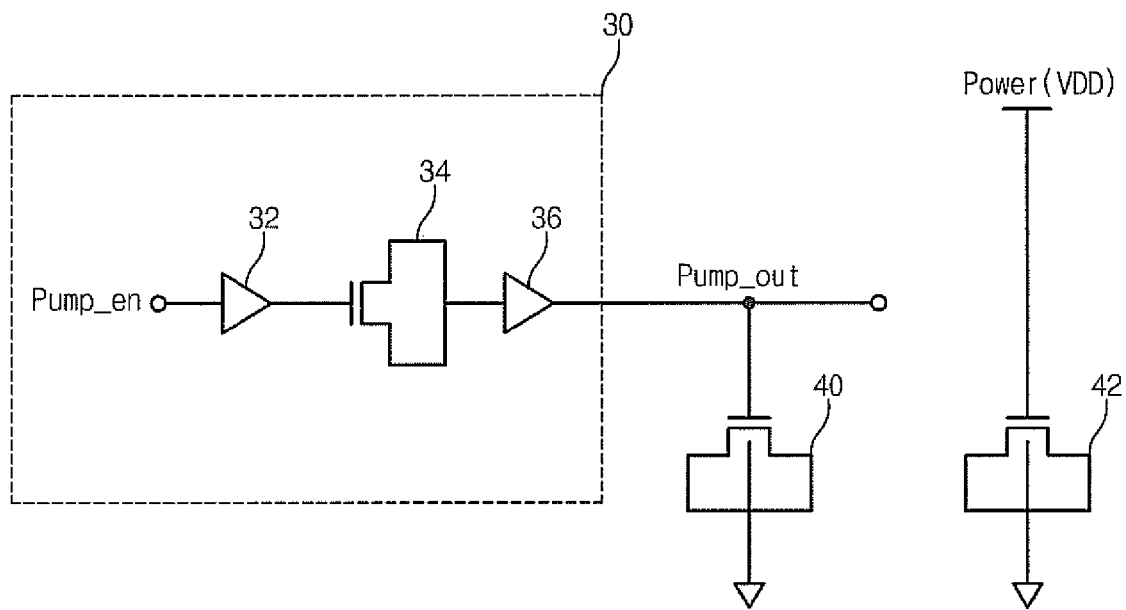
FIG. 5 is a detailed circuit view illustrating capacitors used in a pump circuit of the general DRAM chip.

FIG. 5 is a detailed circuit view illustrating the capacitors used in the pump circuit of the general DRAM chip.

A pump driver region 30 of the DRAM includes drivers 32 and 36 and a pump capacitor 34. Pump driver region 30 drives a pump enable signal Pump_en and outputs a pump output signal Pump_out.

A pump circuit region of the DRAM uses pump capacitor 34. Decoupling capacitors 40 and 42 are used in an output terminal for outputting pump output signal Pump_out and a power terminal. In the general DRAM, CMOS capacitors (gate capacitors) are employed as pump capacitor 34 and decoupling capacitors 40 and 42.

Figure 6:
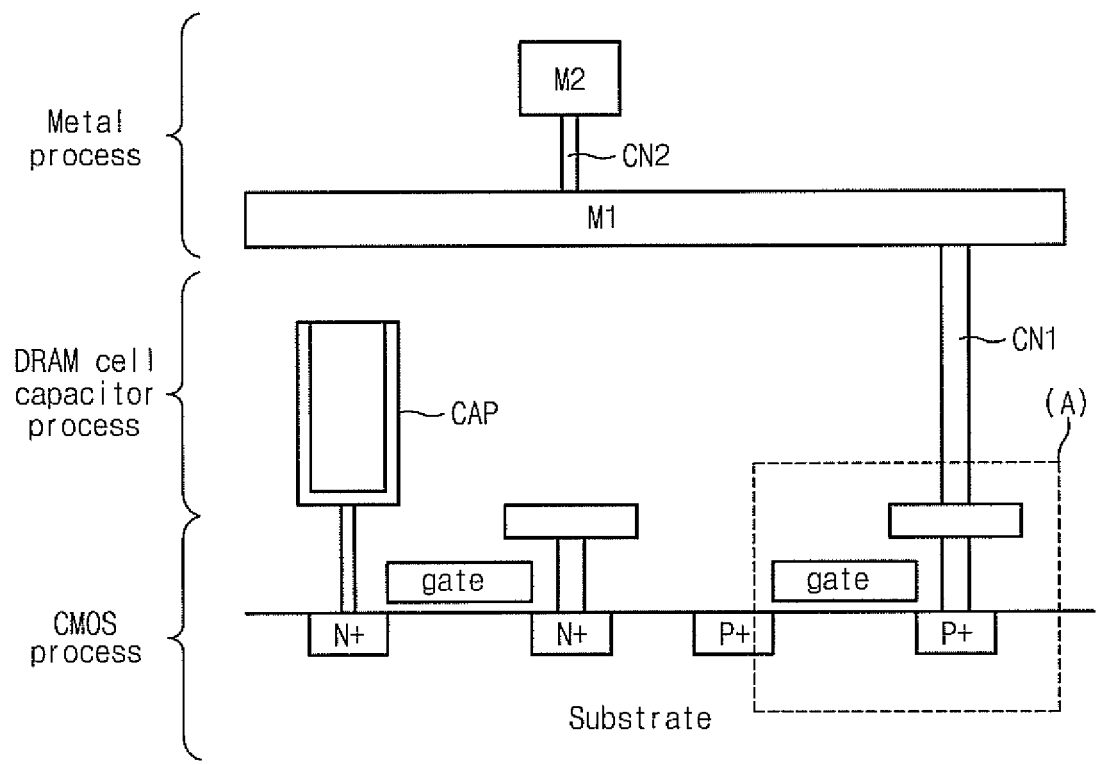
FIG. 6 is a sectional view illustrating the general DRAM.

FIG. 6 is a process sectional view illustrating the general DRAM.

The manufacturing process of the DRAM includes a CMOS process, a DRAM cell capacitor process and a metal process. In the general CMOS process, as shown in region A, a pump capacitor and a decoupling capacitor are formed by using CMOS capacitors.

In the cell capacitor process, a cell capacitor is formed by using a CMOS capacitor. In the metal process, a metal line M1 is formed through a contact node CN1, and a metal line M2 connected to a contact node CN2 is formed at the upper portion of metal line M1.

In the general DRAM with the aforementioned configuration, a dielectric constant of the CMOS capacitors (gate capacitors) is too small. Accordingly, the DRAM requires a large layout area to attain a necessary capacitance.

Figure 7:
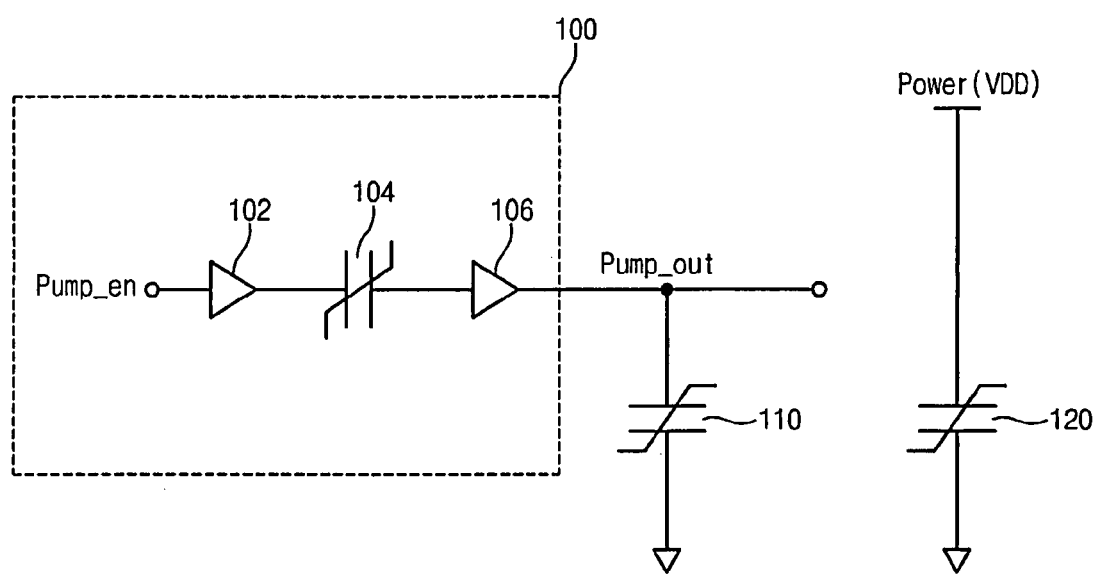
FIG. 7 is a detailed circuit view illustrating ferroelectric capacitors used in a pump circuit of an integrated circuit consistent with the present invention.

FIG. 7 is a detailed circuit view illustrating ferroelectric capacitors used in the pump circuit of the integrated circuit consistent with the present invention.

A pump driver region 100 of the DRAM includes drivers 102 and 106 and a ferroelectric pump capacitor 104. Pump driver region 100 drives a pump enable signal Pump_en and outputs a pump output signal Pump_out.

A pump circuit region of the DRAM uses ferroelectric pump capacitor 104. Ferroelectric decoupling capacitors 110 and 120 are used in an output terminal for outputting pump output signal Pump_out and a power terminal. Mixed process based ferroelectric capacitors are used as the ferroelectric decoupling capacitors 110 and 120.

Ferroelectric pump capacitor 104 mainly boosts the input voltage. Ferroelectric decoupling capacitors 110 and 120 remove power noise and stabilize the voltage.

Ferroelectric capacitors 104, 110 and 120 may be a large capacitance but may be relatively simple in process and structure. In addition, ferroelectric capacitors 104, 110 and 120 are easily formed in a lamination structure with a high capacitance. In the case that ferroelectric capacitors 104, 110 and 120 are formed in a lamination type at the upper portion of the DRAM region and used in the peripheral circuit region of the DRAM, the capacitor region can be maximized without increasing the layout area.

Figure 8:
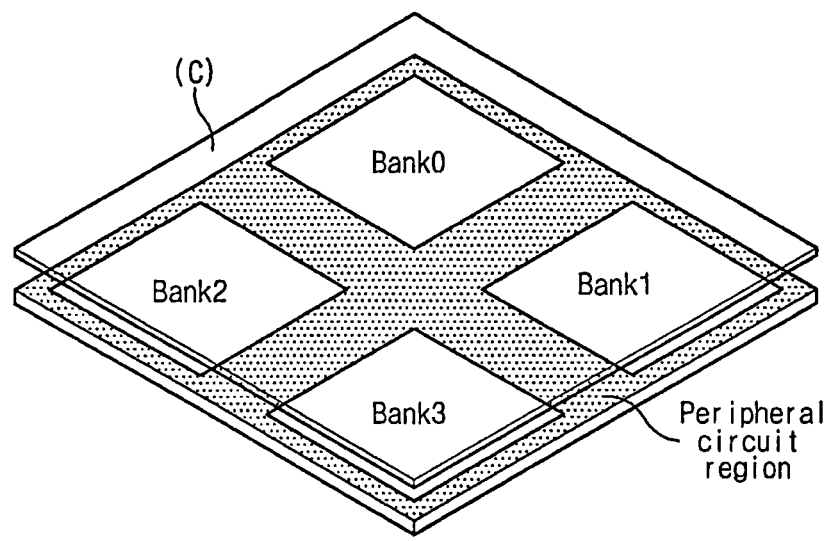
FIG. 8 is a layout view illustrating a state where a DRAM and a ferroelectric capacitor region are laminated in the integrated circuit consistent with the present invention.

FIG. 8 is a layout view illustrating a memory device in which a DRAM and a ferroelectric capacitor region are laminated in the integrated circuit in accordance with the present invention.

In the DRAM, bank 0 to bank 3 represent DRAM cell array regions. A peripheral circuit region represents a region in which active and passive devices including a switching device or CMOS is formed.

A region C laminated at the upper portions of bank 0 to bank 3 regions and the peripheral circuit region becomes a region on which the ferroelectric capacitor region can be laminated. Region C becomes a layout region in which a ferroelectric pump capacitor or a ferroelectric decoupling capacitor is laminated in single or multiple layers.

Consistent with the present invention, the integrated circuit is formed by laminating ferroelectric capacitor region C including the ferroelectric capacitor at the upper portions of the cell array region and the peripheral circuit region. Since the peripheral circuit region and the cell array region of the DRAM have a different process level from that of the ferroelectric capacitor, ferroelectric capacitor region C can be formed in the lamination type at the upper portions of the peripheral circuit region and the cell array region.

The ferroelectric capacitor having a relatively larger dielectric constant than a general paraelectric capacitor or MOS capacitor is used in ferroelectric capacitor region C, thereby reducing the area of the capacitor and the whole layout area of the DRAM chip.

Figure 9:
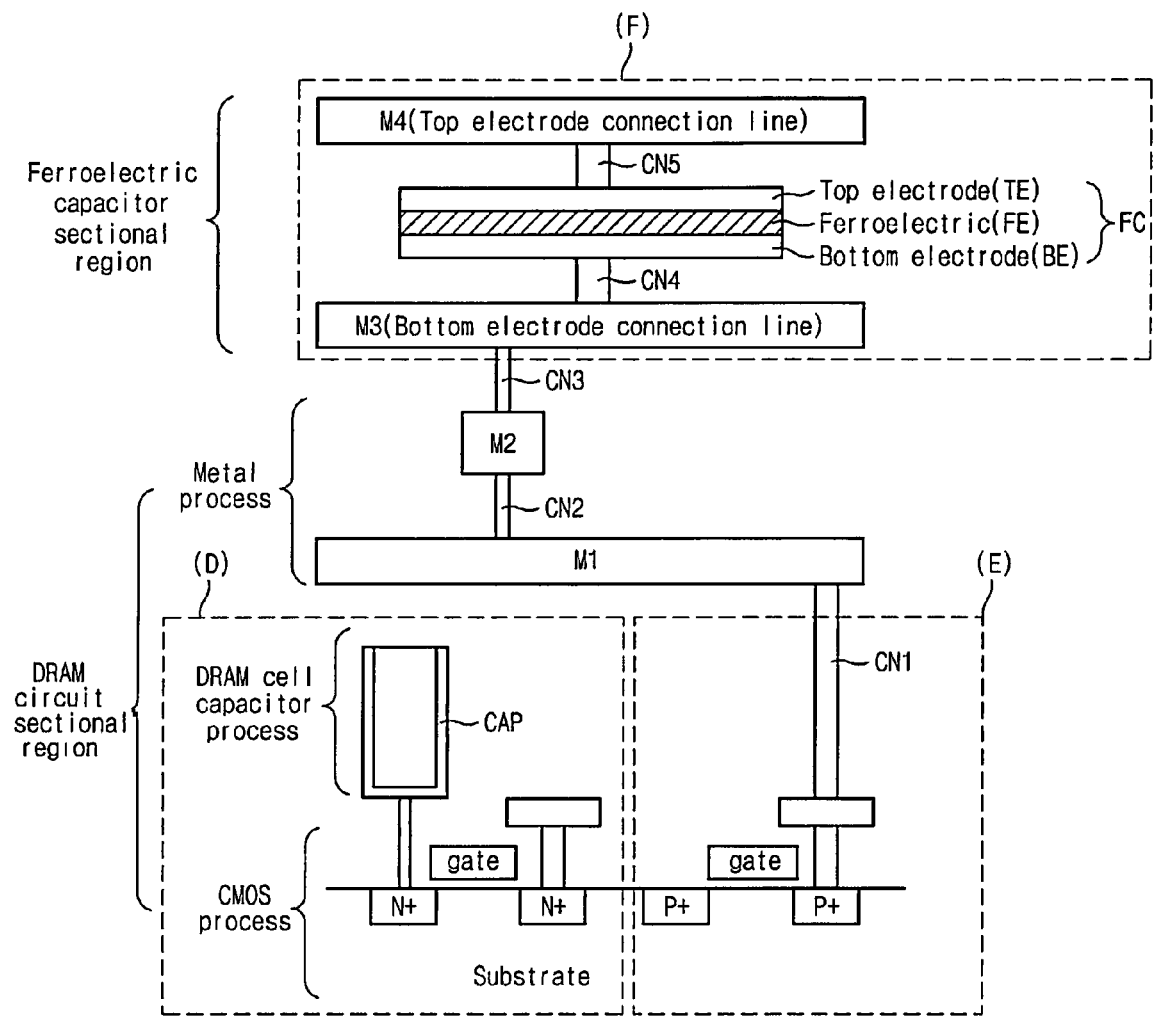
FIG. 9 is a sectional view illustrating a state where the DRAM and the ferroelectric capacitor region are laminated in the integrated circuit consistent with the present invention.

FIG. 9 is a cross-sectional view illustrating a memory device in which a DRAM and a ferroelectric capacitor region are laminated in an integrated circuit consistent with the present invention.

Consistent with the present invention, the manufacturing process of the DRAM includes a CMOS process, a DRAM cell capacitor process, a metal process and a ferroelectric capacitor process. In a memory cell region D, a cell capacitor is formed at an upper portion of a switching device including an N+ region, a bit line BL and a word line WL.

In the CMOS process and the DRAM cell capacitor process, memory cell region D and a peripheral circuit region E are formed by using CMOS capacitors. In peripheral circuit region E, a switching device or a CMOS device including a P+ region and a gate is formed on a substrate.

In the metal process, a metal line M1 and peripheral circuit region E are connected through a contact node CN1, and a metal line M2 is connected to metal line M1 through a contact node CN2 and to a metal line M3 through a contact node CN3.

A ferroelectric capacitor region F is formed in a lamination type at the upper portions of the CMOS circuit region consisting of the switching device, the CMOS device and metal lines M1 and M2, namely, peripheral circuit region E, and memory cell region D. Here, ferroelectric capacitor region F is used as a pump capacitor and a decoupling capacitor. In addition, ferroelectric capacitor region F can be used as the pump and decoupling capacitors in any region including cell array region D and peripheral circuit region E of the DRAM.

In ferroelectric capacitor region F, a contact node CN4 is formed at the upper portion of metal line M3 which is a bottom electrode connection line. The bottom electrode connection line is connected to a bottom electrode BE of a ferroelectric capacitor FC through contact node CN4. A ferroelectric FE and a top electrode TE are sequentially laminated on bottom electrode BE, and a contact node CN5 is formed at the upper portion of top electrode TE. A metal line M4 which is a top electrode connection line is formed at the upper portion of contact node CN5.

In this embodiment, the capacitor formed at the upper portion of cell array region D is made of ferroelectric FE, which is not intended to be limiting. That is, the capacitor can be made of a high dielectric High-k such as a paraelectric.

Figure 10:
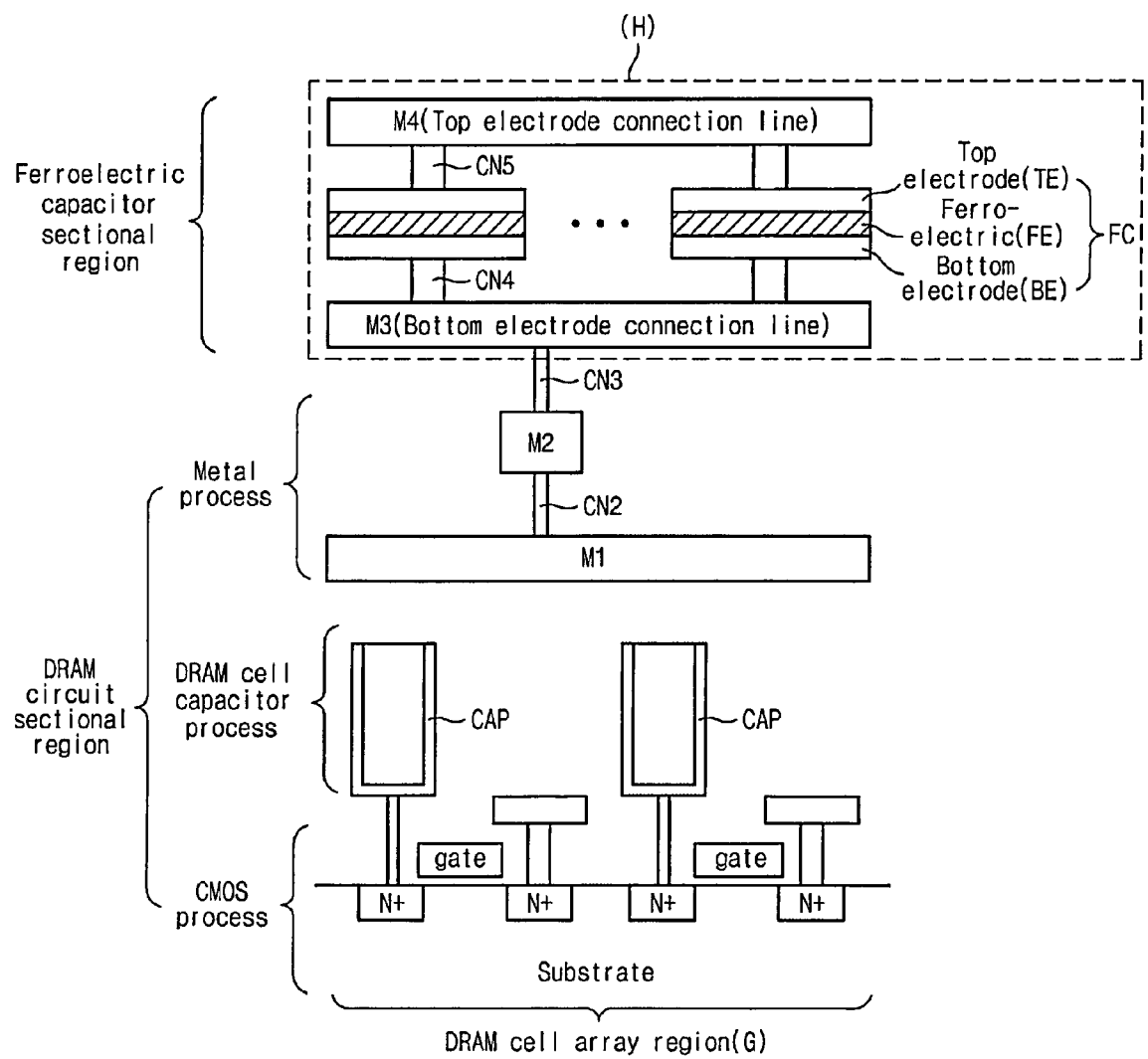
FIG. 10 is a sectional view illustrating an integrated circuit consistent with another embodiment of the present invention.

FIG. 10 is a cross-sectional view illustrating a memory device in which a DRAM and a ferroelectric capacitor region are laminated in an integrated circuit consistent with another embodiment of the present invention.

Consistent with the present invention, the manufacturing process of the DRAM roughly includes a CMOS process, a DRAM cell capacitor process, a metal process and a ferroelectric capacitor process. In a memory cell array region G, a cell capacitor is formed at an upper portion of a switching device including an N+ region, a bit line BL and a word line WL. In the CMOS process and the DRAM cell capacitor process, memory cell array region G is formed by using CMOS capacitors.

In the metal process, a metal line M1 is formed through a contact node CN1, and a metal line M2 is connected to metal line M1 through a contact node CN2 and to a metal line M3 through a contact node CN3.

A ferroelectric capacitor region H is formed in a lamination type at the upper portions of memory cell array region G and the metal process region. Here, ferroelectric capacitor region H is used as a pump capacitor and a decoupling capacitor in memory cell array region G of the DRAM.

In ferroelectric capacitor region H, a contact node CN4 is formed at the upper portion of metal line M3 which is a bottom electrode connection line. The bottom electrode connection line is connected to a bottom electrode BE of a ferroelectric capacitor FC through contact node CN4. A ferroelectric FE and a top electrode TE are sequentially laminated on bottom electrode BE, and a contact node CN5 is formed at the upper portion of top electrode TE. A metal line M4 which is a top electrode connection line is formed at the upper portion of contact node CN5. Ferroelectric capacitor FC is provided in a multiple number on the same layer between the top electrode connection line and the bottom electrode connection line.

Figure 11:
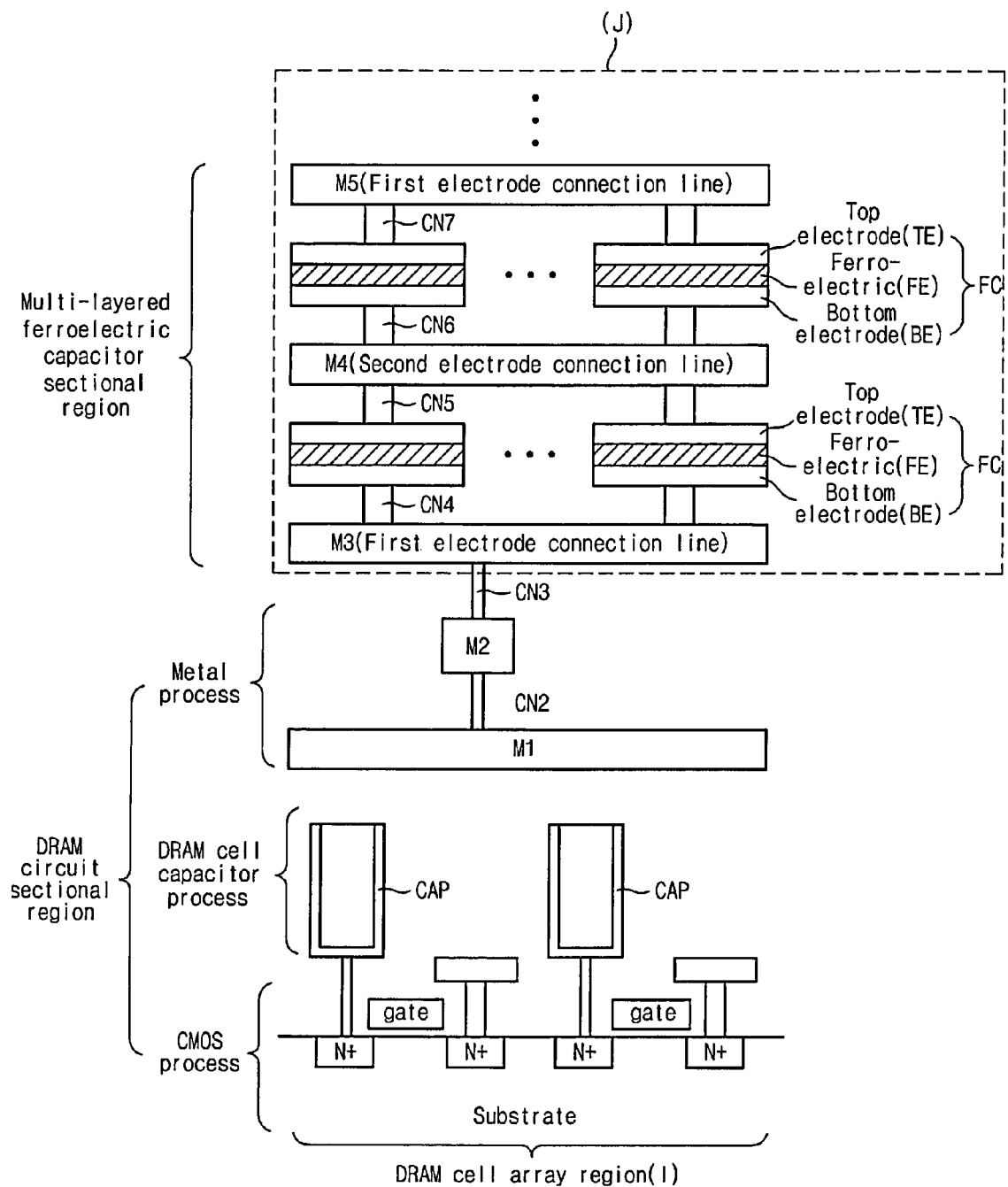
FIG. 11 is a sectional view illustrating an integrated circuit consistent with another embodiment of the present invention.

FIG. 11 is a cross-sectional view illustrating a memory device in which a DRAM and a ferroelectric capacitor region are laminated in an integrated circuit consistent with another embodiment of the present invention.

In the integrated circuit of FIG. 11, a ferroelectric capacitor region J is formed in a lamination type at upper portions of a memory cell array region I and a metal process region. Here, ferroelectric capacitor region J is used as a pump capacitor and a decoupling capacitor in memory cell array region I of the DRAM.

In ferroelectric capacitor region J, a contact node CN4 is formed at an upper portion of a metal line M3 which is a first electrode connection line. The first electrode connection line is connected to a bottom electrode BE of a ferroelectric capacitor FC through contact node CN4. A ferroelectric FE and a top electrode TE are sequentially laminated on bottom electrode BE, and a contact node CN5 is formed at the upper portion of top electrode TE. A metal line M4 which is a second electrode connection line is formed at the upper portion of contact node CN5.

In addition, a contact node CN6 is formed at the upper portion of metal line M4 which is the second electrode connection line. The second electrode connection line is connected to a bottom electrode BE of a ferroelectric capacitor FC through the contact node CN6. A ferroelectric FE and a top electrode TE are sequentially laminated on the bottom electrode BE, and a contact node CN7 is formed at the upper portion of top electrode TE. A metal line M5 which is a first electrode connection line is formed at the upper portion of contact node CN7.

Ferroelectric capacitors FC are laminated in multiple layers between metal line M5 and metal line M3. Metal lines M3 and M5 which are the first electrode connection lines share metal line M4 which is the second electrode connection line. Ferroelectric capacitors FC with the lamination structure selectively use metal lines M3 and M5 according to use or non-use of the ferroelectric capacitors FC disposed at the right and left sides.

Figure 12:
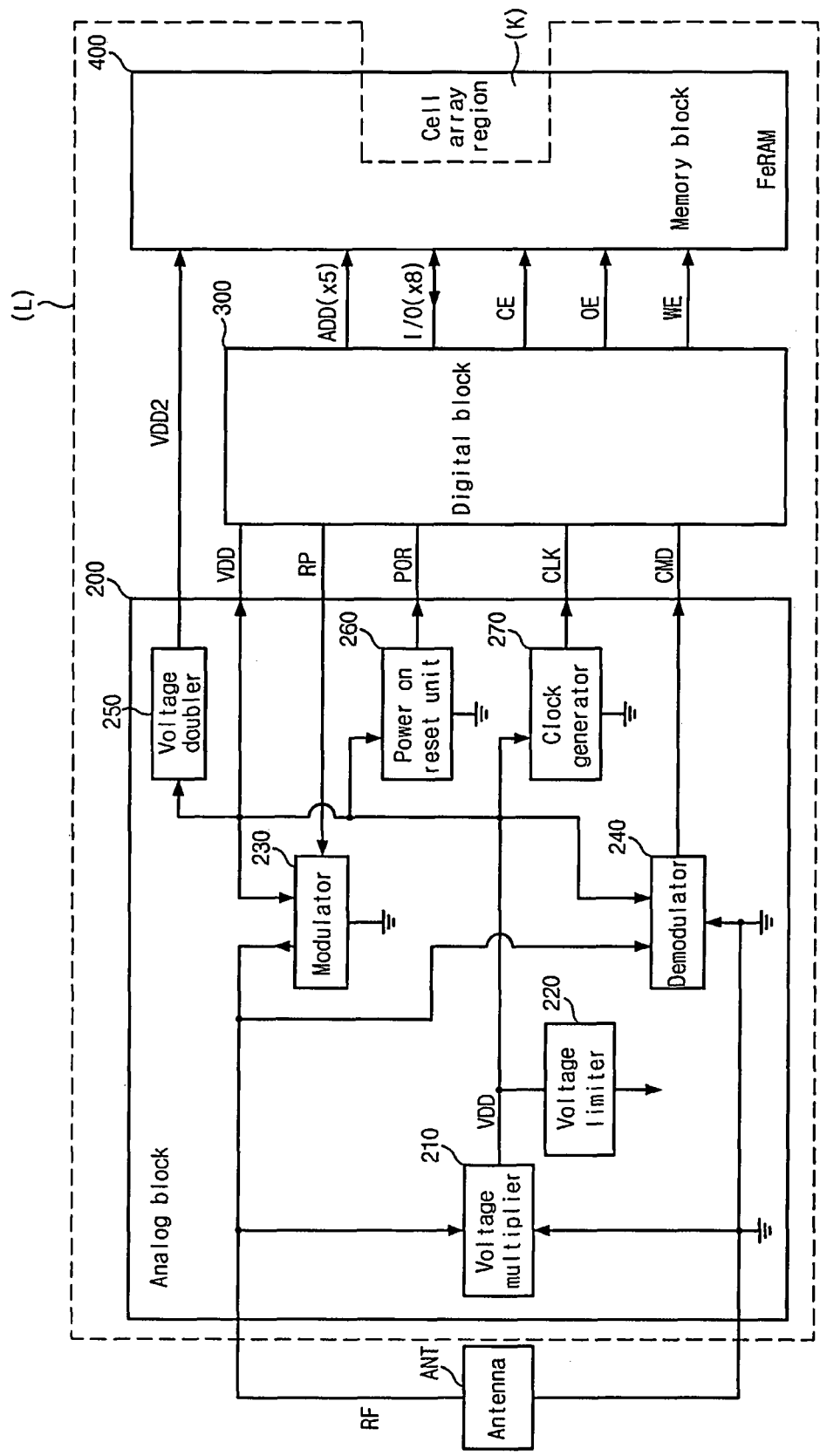
FIG. 12 is a configuration view illustrating conceptual characteristics of the integrated circuit consistent with the present invention.

FIG. 12 is a configuration view illustrating an RFID device consistent with the present invention.

Consistent with the present invention, the RFID device includes an analog block 200, a digital block 300 and a nonvolatile FeRAM 400.

Analog block 200 consists of a voltage multiplier 210, a voltage limiter 220, a modulator 230, a demodulator 240, a voltage doubler 250, a power on reset unit 260, and a clock generator 270.

An antenna ANT of analog block 200 is provided to transmit/receive data between an external reader or writer and the RFID. Voltage multiplier 210 generates a power voltage VDD which is a driving voltage of the RFID according to a radio frequency signal RF from the antenna ANT. Voltage limiter 220 restricts a size of a transmission voltage of radio frequency signal RF from antenna ANT, and outputs the resulting voltage to demodulator 240.

Modulator 230 modulates a response signal RP from digital block 300, and transmits the resulting signal to antenna ANT. Demodulator 240 detects an operation command signal from radio frequency signal RF from antenna ANT according to the output voltage from voltage multiplier 210 and voltage limiter 220, and outputs a command signal CMD to digital block 300.

Voltage doubler 250 boosts power voltage VDD from voltage multiplier 210, and supplies a double boosted voltage VDD2 to FeRAM 400. The power on reset unit 260 senses output voltage VDD from voltage multiplier 210, and outputs a power on reset signal POR for controlling a reset operation to digital block 300. Clock generator 270 supplies a clock signal CLK to digital block 300 for controlling the operation of digital block 300 according to output voltage VDD from voltage multiplier 210.

Digital block 300 receives power voltage VDD, power on reset signal POR, clock signal CLK and command signal CMD from analog block 200, interprets command signal CMD, generates a control signal and a processing signal, and outputs the corresponding response signal RP to analog block 200. In addition, digital block 300 outputs an address ADD, an input/output data I/O, a chip enable signal CE, an output enable signal OE and a write enable signal WE to FeRAM 400. FeRAM 400 is a memory block for reading/writing data by using a nonvolatile ferroelectric capacitor device.

In the RFID device with the above-described configuration, a ferroelectric capacitance unit region including a ferroelectric capacitor is formed at an upper portion of a peripheral CMOS circuit region in the whole peripheral circuit region L except an FeRAM cell array region K of FeRAM 400. Because peripheral circuit region L and the ferroelectric capacitor have different process levels, the ferroelectric capacitance unit region can be formed in a lamination type at the upper portion of peripheral circuit region L.

The ferroelectric capacitor having a relatively larger dielectric constant than a general paraelectric capacitor or MOS capacitor is used in the ferroelectric capacitance unit region, thereby reducing the area of the capacitor and the whole layout area of the RFID device.

Figure 13:
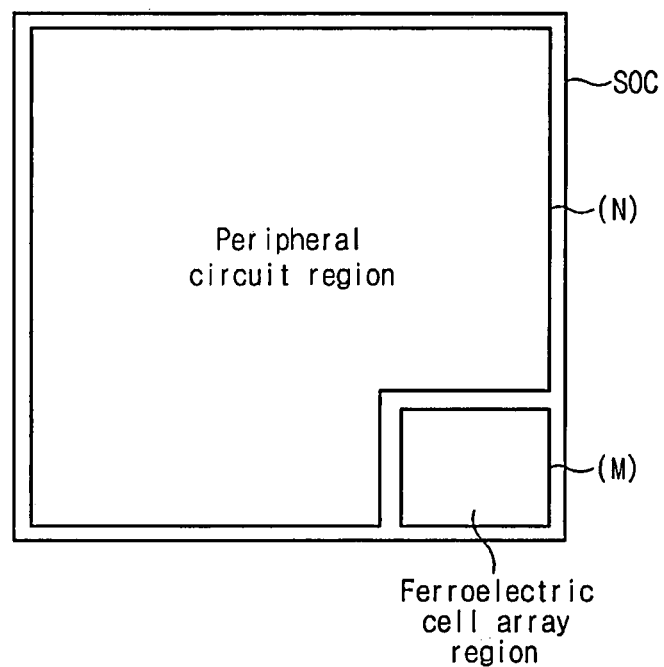
FIG. 13 is an exemplary view illustrating an integrated circuit consistent with another embodiment of the present invention.

FIG. 13 is an exemplary view illustrating an integrated circuit consistent with another embodiment of the present invention.

In an SoC consistent with the present invention, a ferroelectric capacitance unit region including a ferroelectric capacitor is formed at an upper portion of a peripheral CMOS circuit region in the whole peripheral circuit region N except a cell array region M including a ferroelectric capacitor. The ferroelectric capacitor having a relatively larger dielectric constant than a general paraelectric capacitor is used in the ferroelectric capacitance unit region, thereby reducing the area of the capacitor and the whole layout area of the SoC.

Figure 14:
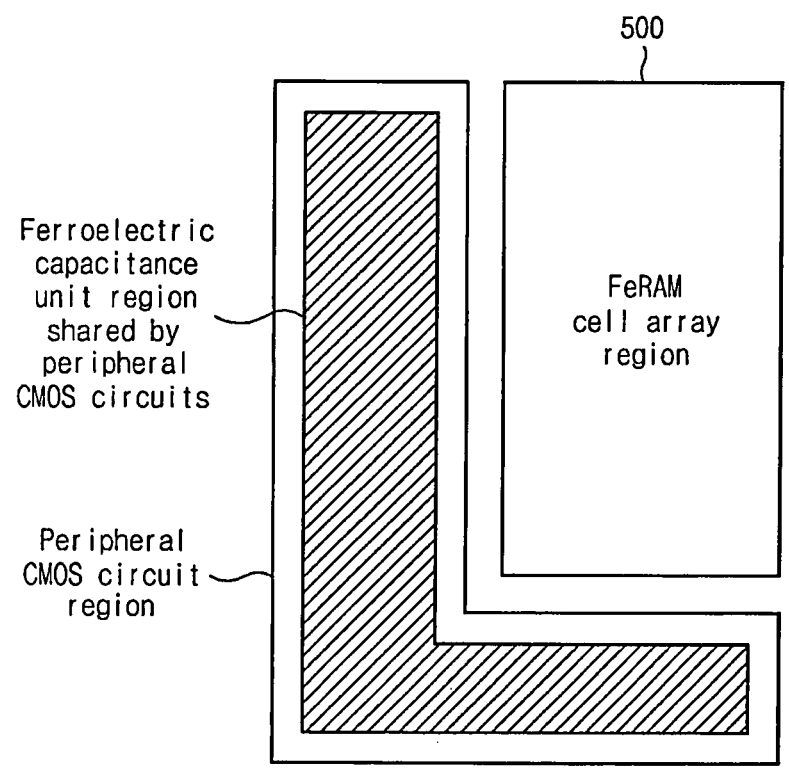
FIG. 14 is an exemplary view illustrating an integrated circuit consistent with another embodiment of the present invention.

FIG. 14 is an exemplary view illustrating an integrated circuit consistent with another embodiment of the present invention.

An FeRAM of FIG. 14 includes an FeRAM cell array region 500, and a peripheral CMOS circuit region formed in the periphery of the FeRAM cell array region 500. A ferroelectric capacitance unit region sharing a ferroelectric capacitor is formed at the upper portion of the peripheral CMOS circuit region. Here, the CMOS circuit region means a region including active and passive devices such as a CMOS.

Figure 15:
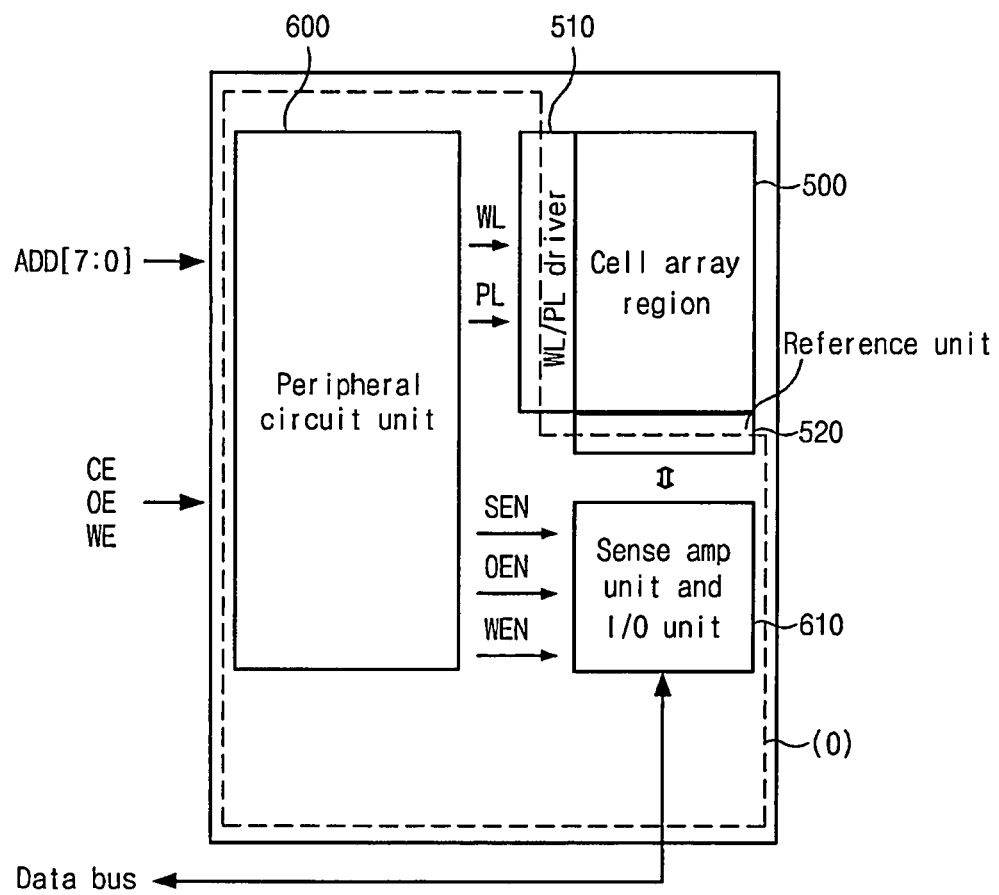
FIG. 15 is a detailed configuration view illustrating the integrated circuit consistent with the embodiment of FIG. 14.

FIG. 15 is a detailed configuration view illustrating the FeRAM of FIG. 14.

Consistent with the present invention, the FeRAM includes cell array region 500, a word line/plate line driver 510, a reference unit 520, a peripheral circuit unit 600, a sense amp unit and an input/output unit 610.

Here, peripheral circuit unit 600 controls a word line WL and a plate line PL for driving cell array region 500 according to an address ADD, a chip enable signal CE, an output enable signal OE, and a write enable signal WE applied from a digital block 300 or another external source. In addition, peripheral circuit unit 600 outputs a sense amp enable signal SEN for adjusting enabling of a sense amplifier, an output enable signal OEN for outputting the data sensed in the sense amplifier to a data bus, and a write enable signal WEN for writing the data from the data bus on cell array region 500.

Cell array region 500 includes a plurality of unit cells respectively consisting of a nonvolatile ferroelectric capacitor device and a switching device, stores data on the nonvolatile ferroelectric capacitor devices, and reads the stored data. Word line/plate line driver 510 drives word line WL and plate line PL. Reference unit 520 controls a reference voltage level of sense amp unit and input/output unit 610.

The operation of sense amp unit and input/output unit 610 is controlled according to sense amp enable signal SEN, output enable signal OEN and write enable signal WEN on the basis of reference voltage REF from reference unit 520. Sense amp unit and input/output unit 610 senses and amplifies the data from cell array region 500, outputs the resulting data to the data bus, and transfers the data from the data bus to cell array region 500.

In the FeRAM with the aforementioned configuration, the ferroelectric capacitance unit region sharing the ferroelectric capacitor is formed on the upper layer of the peripheral CMOS circuit region, namely, word line/plate line driver 510, reference unit 520, peripheral circuit unit 600, and sense amp unit and input/output unit 610 in peripheral circuit region 0 except FeRAM cell array region 500.

Figure 16:
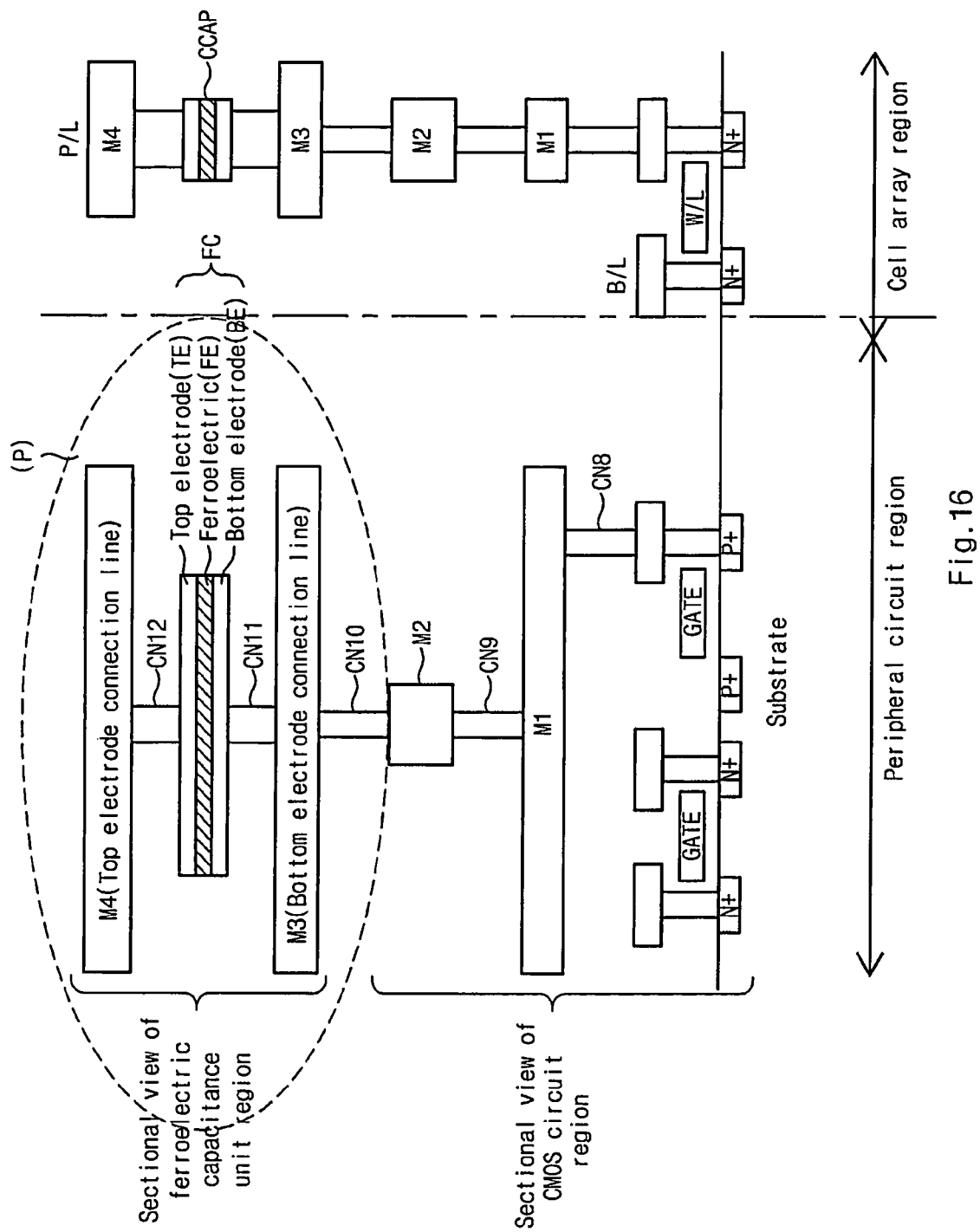
FIG. 16 is a sectional view illustrating a ferroelectric capacitance unit region and a circuit region consistent with the embodiments of FIGS. 12 to 14.

FIG. 16 is a cross-sectional view illustrating the ferroelectric capacitance unit region and the peripheral CMOS circuit region consistent with the embodiments of FIGS. 12 to 14.

Referring to FIG. 16, in a cell array region, a few layers of metal lines M1 to M3 are formed at an upper portion of a switching device including an N+ region, a bit line B/L and a word line W/L. A cell capacitor CCAP is formed at the upper portion of metal line M3 through a contact node. A metal line M4 which is a plate line P/L is formed at the upper portion of cell capacitor CCAP through a contact node.

In a peripheral circuit region, a switching device or a CMOS device including an N+ region, a P+ region and a gate is formed on a substrate. A metal line M1 is connected to the P+ region through a contact node CN8, and a metal line M2 is connected to metal line M1 through a contact node CN9 and to a metal line M3 through a contact node CN10.

A ferroelectric capacitance unit region P is formed in a lamination type at the upper portion of the CMOS circuit region including the switching device, the CMOS device and metal lines M1 and M2, namely, the peripheral circuits.

In ferroelectric capacitance unit region P, a contact node CN11 is formed at the upper portion of metal line M3 which is a bottom electrode connection line. The bottom electrode connection line is connected to a bottom electrode BE of a ferroelectric capacitor through contact node CN11. A ferroelectric FE and a top electrode TE are sequentially laminated on bottom electrode BE, and a contact node CN12 is formed at the upper portion of top electrode TE. A metal line M4 which is a top electrode connection line is formed at the upper portion of contact node CN12.

Since cell capacitor CCAP is used in the cell array region, a capacitance capacitor cannot be additionally installed on the same layer. However, different from the cell array region, the peripheral circuit region has a space for freely forming a capacitor at the upper portion of the CMOS circuit structure.

Accordingly, the CMOS circuit structure of the peripheral circuit is formed before the process for forming the capacitor, and the capacitor is formed at the upper portion of the CMOS circuit structure. It is thus possible to form the capacitance capacitor within the layout shared in the peripheral circuit region without an independent layout area.

Exemplary capacitors that can be shared in the CMOS circuit region include a metal-ferroelectric-metal (MFM) ferroelectric capacitor and a metal-insulator-metal (MIM) paraelectric capacitor with a high dielectric constant.

Especially, in the case of the RFID chip, a small number of metal lines M are used in analog block 200 and memory block 400 according to the circuit configuration. On the contrary, a large number of metal lines M are used in digital block 300.

Accordingly, a large number of capacitors are allocated to analog block 200 and memory block 400, and a small number of capacitors are allocated to digital block 300 mostly using the CMOS device. In the case that the ferroelectric capacitance unit region is shared in the whole peripheral circuit region, signal lines of all metal lines M, except a signal line of metal line M3 (or M4) allocated to the ferroelectric capacitor, can be used for connection of circuits other than the capacitor electrodes. In addition, the metal line of the peripheral circuit which does not use the layout area for the capacitor can be freely used for signal connection.

That is, in the peripheral circuit region, the necessary area for the capacitor is secured in advance in consideration of the capacitance and area of the capacitor, and the capacitor region of the peripheral circuit is allocated. The metal lines of the peripheral circuit region except metal line M for the capacitor region are used as the circuit connection lines.

Figure 17:
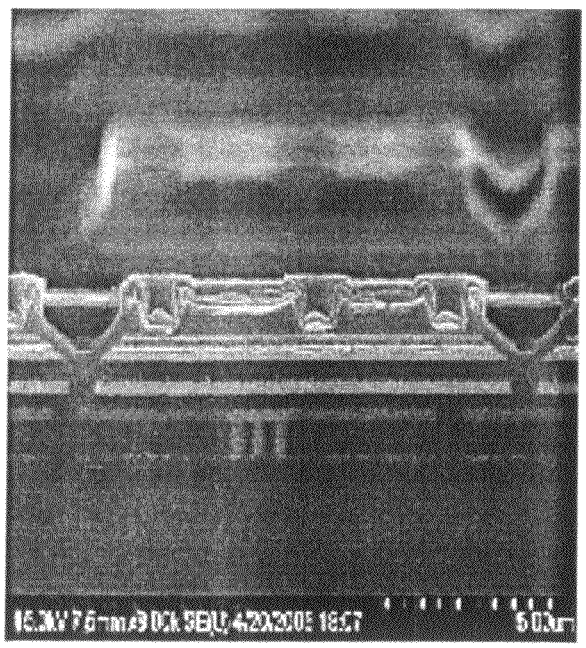
FIG. 17 is a sectional view illustrating a state where one capacitor region is formed at the upper portion of the circuit region in an RFID chip consistence with the embodiment of FIG. 12.
Figure 18:
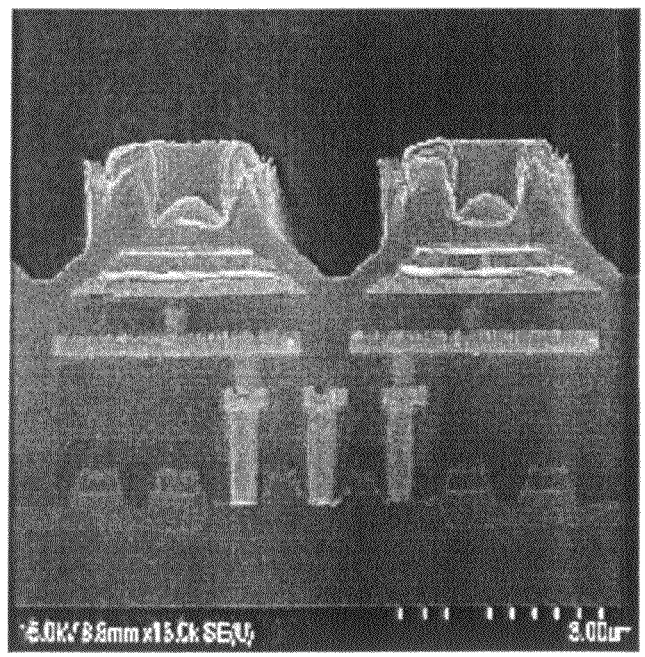
FIG. 18 is a sectional view illustrating a state where two capacitor regions are formed at the upper portion of the circuit region in the RFID chip consistent with the embodiment of FIG. 12.
Figure 19:
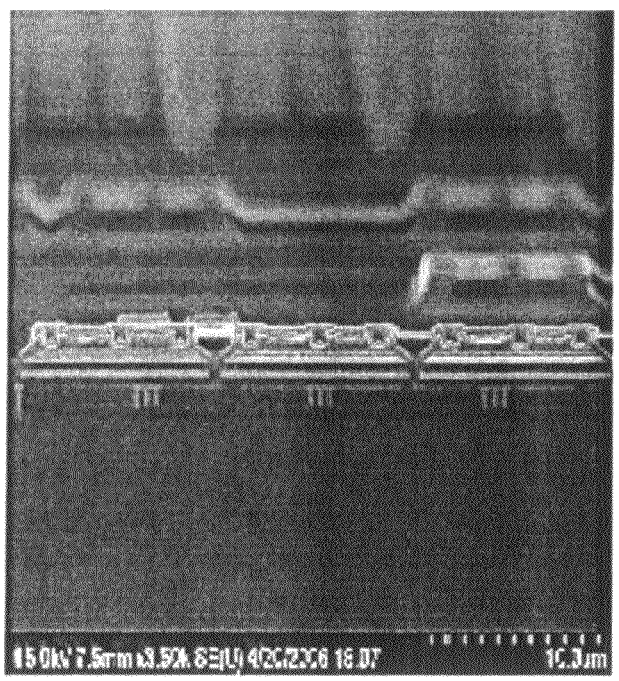
FIG. 19 is a sectional view illustrating a state where a plurality of capacitor regions are formed at the upper portion of the circuit region in the RFID chip consistent with the embodiment of FIG. 12.

FIG. 17 is a process sectional view illustrating a state where one capacitor region is formed at the upper portion of the CMOS peripheral circuit region in the RFID chip in accordance with the embodiment of FIG. 12. FIG. 18 is a process sectional view illustrating a state where two capacitor regions are formed at the upper portion of the circuit region in the RFID chip consistent with the embodiment of FIG. 12. FIG. 19 is a process sectional view illustrating a state where a plurality of capacitor regions are formed at the upper portion of the circuit region in the RFID chip consistent with the embodiment of FIG. 12.

As illustrated in the process sectional views of FIGS. 17 to 19, the CMOS circuit structure of the peripheral circuit is formed before the process for forming the capacitor, and the capacitor region is formed at the upper portion of the CMOS circuit structure. It is thus possible to form the capacitance capacitor within the layout shared in the peripheral circuit region without an independent layout area.

Figure 20:
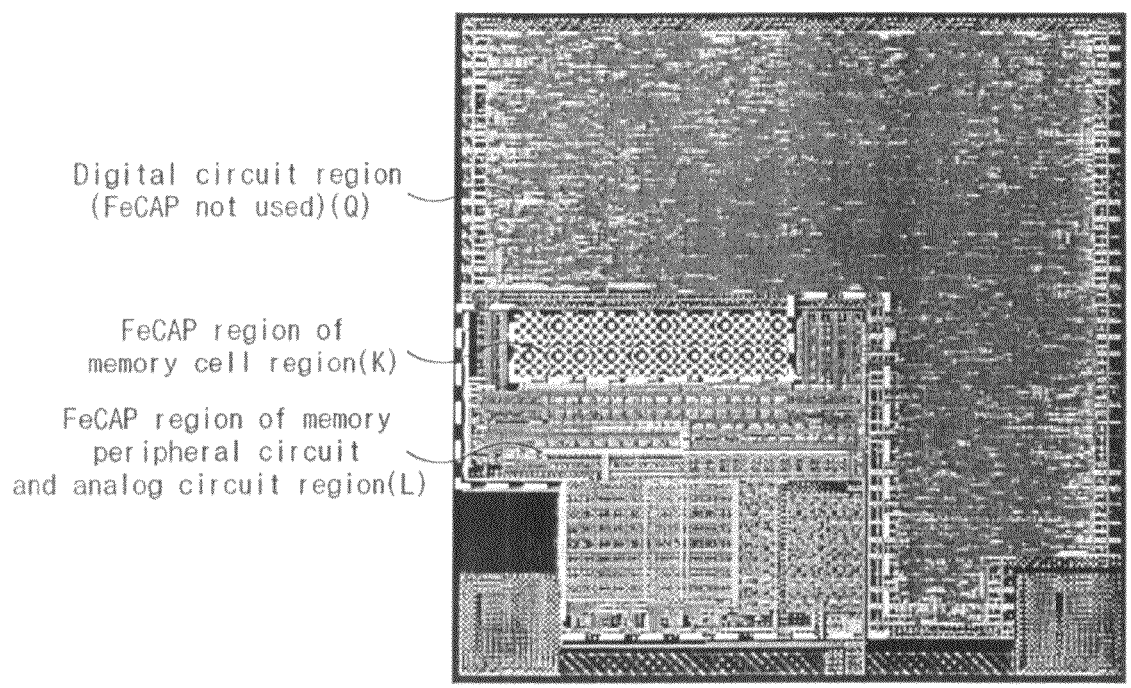
FIG. 20 is a layout view illustrating a region in which a lamination type capacitor is disposed in the RFID chip consistent with the embodiment of FIG. 12.

FIG. 20 is a layout view illustrating a region in which the lamination type capacitor is disposed in the RFID chip consistent with the embodiment of FIG. 12.

As depicted in FIG. 20, in the RFID device, the ferroelectric capacitance unit region including the ferroelectric capacitor is formed at the upper portion of the peripheral CMOS circuit region in the whole peripheral circuit region L except FeRAM cell array region K of memory block 400. Since peripheral circuit region L and the ferroelectric capacitor have different process levels, the ferroelectric capacitance unit region can be formed in a lamination type at the upper portion of peripheral circuit region L. Here, Q denotes a region which does not use a ferroelectric capacitor in a digital circuit region.

Consistent with the present invention, the RFID, the SoC and the FeRAM have been exemplified as the integrated circuits, which is not intended to be limiting. That is, the present invention can be applied to a smart card or a processor which is another integrated circuit.

As discussed earlier, consistent with the present invention, the integrated circuit attains the following effects.

Consistent with the present invention there is provided an integrated circuit which can maximize the capacitor region without increasing the layout area.

Consistent with the present invention there is provided an integrated circuit which can maximize the capacitor region by forming the lamination type capacitor.

Consistent with the present invention there is provided an integrated circuit which can maximize the capacitor region by adding a simple process, by forming the lamination type capacitor after the manufacturing process of the chip.

Consistent with the present invention there can be achieved high speed operation by reducing the chip area, the cost and the delay path, by introducing the ferroelectric capacitor to the circuit using the large capacitance capacitor in the DRAM.

Consistent with the present invention reduction in power noise by introducing the ferroelectric capacitor to the circuit using the large capacitance capacitor in the DRAM can be achieved.

Consistent with the present invention reduction in the area of the DRAM chip circuit by removing the area occupied by the pump capacitor and the decoupling capacitor can be achieved.

Consistent with the present invention maximizing the capacitor region by forming the lamination type capacitor in the whole region allowed by the layout on the on-chip can be achieved.

Consistent with the present invention reduction in the capacitance of the capacitor and the whole size of the integrated circuit, by forming the CMOS circuit structure of the peripheral circuit before the process for forming the capacitor in the integrated circuit such as the RFID device, SoC or FeRAM, forming the capacitor at the upper portion of the CMOS circuit, and sharing the capacitance capacitor in the peripheral circuit region without the independent layout area can be achieved.

It will be apparent to those skilled in the art that various modifications may be made without departing from the spirit and scope consistent with the invention as defined by the appended claims.

What is claimed is:

1. An integrated circuit, comprising:
   a cell array region having a cell capacitor;
   a peripheral circuit region formed adjacent to the cell array region and not having the cell capacitor;
   a metal line laminated over the cell array region and the peripheral circuit region, wherein the metal line is electrically coupled to a ferroelectric capacitor region and the peripheral circuit region; and
   the ferroelectric capacitor region having a laminated structure of a plurality of ferroelectric capacitor devices and provided over the cell array region and the peripheral circuit region,
   wherein the plurality of ferroelectric capacitor devices are formed in a different layer from the cell capacitor,
   wherein the plurality of ferroelectric capacitor devices are electrically coupled to the peripheral circuit region through the metal line.

2. The integrated circuit according to claim 1, wherein the plurality of ferroelectric capacitor devices are used as a pump capacitor used in a pump circuit of the peripheral circuit region.

3. The integrated circuit according to claim 2, wherein the plurality of ferroelectric capacitor devices are used as a decoupling capacitor used in an output terminal of the pump circuit of the peripheral circuit region.

4. The integrated circuit according to claim 1, wherein the plurality of ferroelectric capacitor devices are used as a decoupling capacitor used in a power terminal of the peripheral circuit region.

5. The integrated circuit according to claim 1, wherein the integrated circuit comprises a dynamic random access memory (DRAM).

6. The integrated circuit according to claim 1, wherein the peripheral circuit region is a Complementary Metal-Oxide Semiconductor (CMOS) circuit region comprising active and passive devices.

7. The integrated circuit according to claim 1, wherein the ferroelectric capacitor region is formed using a lamination process over the cell array region and the peripheral circuit region.

8. An integrated circuit, comprising:
a DRAM including a bank region having a cell capacitor;
a peripheral circuit region formed adjacent to the DRAM and not having the cell capacitor;
a metal line laminated over the DRAM and the peripheral circuit region, wherein the metal line is electrically coupled to a ferroelectric capacitor region and the peripheral circuit region; and
the ferroelectric capacitor region having a laminated structure of a plurality of ferroelectric capacitor devices and provided over the DRAM,
wherein a part of the peripheral circuit region uses the plurality of ferroelectric capacitor devices,
wherein the plurality of ferroelectric capacitor devices are formed in a different layer from the cell capacitor,
wherein the plurality of ferroelectric capacitor devices are electrically coupled to the peripheral circuit region through the metal line.

9. The integrated circuit according to claim 8, wherein the part of the peripheral circuit region includes a pump circuit region and a power terminal.

10. The integrated circuit according to claim 8, wherein the peripheral circuit region is a Complementary Metal-Oxide Semiconductor (CMOS) circuit region comprising active and passive devices.

11. The integrated circuit according to claim 8, wherein the ferroelectric capacitor region is formed using a lamination process over the DRAM.

12. An integrated circuit, comprising:
a cell array region having a ferroelectric capacitor;
a peripheral circuit region not having a cell capacitor;
a metal line laminated over the cell array region and the peripheral circuit region, wherein the metal line is electrically coupled to a ferroelectric capacitance region and the peripheral circuit region; and
the ferroelectric capacitance region having a laminated structure of a plurality of ferroelectric capacitor devices and provided over the peripheral circuit region,
wherein the plurality of ferroelectric capacitor devices are electrically coupled to the peripheral circuit region through the metal line, and the ferroelectric capacitance region is at a height above the cell array region.

13. The integrated circuit according to claim 12, wherein the ferroelectric capacitance region is shared by peripheral circuits of the peripheral circuit region.

14. The integrated circuit according to claim 12, wherein the integrated circuit comprises a radio frequency identification (RFID) tag.

15. The integrated circuit according to claim 12, wherein the integrated circuit comprises a system-on-chip (SOC).

16. The integrated circuit according to claim 12, wherein the integrated circuit comprises a ferroelectric random access memory (FeRAM).

17. The integrated circuit according to claim 12, wherein the peripheral circuit region is a Complementary Metal-Oxide Semiconductor (CMOS) circuit region comprising active and manual devices.

18. The integrated circuit according to claim 17, wherein the ferroelectric capacitance region is formed using a lamination process over the Complementary Metal-Oxide Semiconductor (CMOS) circuit region.

\* \* \* \* \*